United States Patent
Shaw et al.

(10) Patent No.: US 9,529,940 B2
(45) Date of Patent: Dec. 27, 2016

(54) MODULAR SUBSTATION PROTECTION AND CONTROL SYSTEM

(71) Applicant: AEP Transmission Holding Company, LLC, Colombus, OH (US)

(72) Inventors: Aaron Shaw, Pataskala, OH (US); Manish Thakur, Westerville, OH (US)

(73) Assignee: AEP Transmission Holding Company, LLC, Columbus, OH (US)

( * ) Notice: Subject to any disclaimer, the term of this patent is extended or adjusted under 35 U.S.C. 154(b) by 817 days.

(21) Appl. No.: 13/922,215

(22) Filed: Jun. 19, 2013

(65) Prior Publication Data

US 2013/0346031 A1    Dec. 26, 2013

Related U.S. Application Data

(60) Provisional application No. 61/661,707, filed on Jun. 19, 2012.

(51) Int. Cl.
| | |
|---|---|
| G06F 9/00 | (2006.01) |
| G06F 17/50 | (2006.01) |
| H02J 11/00 | (2006.01) |
| H02J 13/00 | (2006.01) |

(52) U.S. Cl.
CPC ............ G06F 17/50 (2013.01); G06F 9/00 (2013.01); H02J 11/00 (2013.01); H02J 13/0086 (2013.01); *Y02E 60/723* (2013.01); *Y04S 10/16* (2013.01)

(58) Field of Classification Search
USPC ....... 703/1, 18; 361/679.31, 679.32; 257/80; 370/228; 702/60
See application file for complete search history.

(56) References Cited

U.S. PATENT DOCUMENTS

| | | | |
|---|---|---|---|
| 2,090,671 | A | 8/1937 | Gay |
| 2,943,717 | A | 7/1960 | Latzko |
| 2,952,799 | A | 9/1960 | Wortman et al. |
| 3,556,310 | A | 1/1971 | Loukotsky |
| 3,832,605 | A | 8/1974 | Clark, Jr. |
| 3,925,679 | A | 12/1975 | Berman et al. |
| 4,053,724 | A | 10/1977 | Liona |
| 4,134,148 | A | 1/1979 | Schubert et al. |
| RE30,229 | E | 3/1980 | Berman et al. |
| 4,469,954 | A | 9/1984 | Maehara |

(Continued)

FOREIGN PATENT DOCUMENTS

| | | |
|---|---|---|
| CN | 201956597 U | 8/2011 |
| DE | 19650931 A1 | 6/1998 |

(Continued)

OTHER PUBLICATIONS

Willoughby, Ron, Modular Integrated Transportable Substation—A Fully Integrated System, Bulletin B100-06018-The Line, May 2006, http://www. cooperindustries.com/content/dam/public/powersystems/resources/library/100_Promotional/B10006018.pdf.

(Continued)

*Primary Examiner* — Thai Phan
(74) *Attorney, Agent, or Firm* — Standley Law Group LLP

(57) ABSTRACT

The invention provides a modular protection and control system for power substations. Embodiments provide for selection of modular protection and control assets have a modular plug-and-play features incorporated into standardized modular panels for installation in modular base modules and expansion modules.

20 Claims, 12 Drawing Sheets

(56) References Cited

U.S. PATENT DOCUMENTS

| | | |
|---|---|---|
| 4,545,159 A | 10/1985 | Rizk |
| 4,758,167 A | 7/1988 | Bepoix |
| 5,648,888 A | 7/1997 | Le Francois et al. |
| 5,675,194 A | 10/1997 | Domigan |
| 6,169,651 B1 | 1/2001 | Dias |
| 6,215,653 B1 | 4/2001 | Cochran et al. |
| 6,233,137 B1 | 5/2001 | Kolos et al. |
| 6,250,682 B1 | 6/2001 | Betz et al. |
| 6,259,173 B1 | 7/2001 | Dias et al. |
| 6,675,302 B2 | 1/2004 | Ykema |
| 6,688,048 B2 | 2/2004 | Staschik |
| 6,925,761 B1 | 8/2005 | De La Marche |
| 7,081,682 B2 | 7/2006 | Campion |
| 7,480,246 B2 * | 1/2009 | Agarwal .................. H04L 45/00 370/235 |
| 7,560,831 B2 | 7/2009 | Whitted et al. |
| 8,001,730 B2 | 8/2011 | Wallance |
| 8,040,665 B2 | 10/2011 | Thrue |
| 8,148,654 B2 | 4/2012 | Schmidt et al. |
| 8,198,966 B2 | 6/2012 | Thrue et al. |
| 8,207,621 B2 | 6/2012 | Hunter |
| 8,345,440 B2 | 1/2013 | Wu et al. |
| 8,363,389 B2 | 1/2013 | Jurek |
| 2003/0209717 A1 * | 11/2003 | Okazaki ................. B82Y 20/00 257/80 |
| 2004/0176940 A1 | 9/2004 | Bosshart et al. |
| 2007/0107321 A1 | 5/2007 | Sarine et al. |
| 2008/0065270 A1 | 3/2008 | Kasztenny et al. |
| 2008/0092043 A1 * | 4/2008 | Trethewey ............ G06F 1/1626 715/705 |
| 2009/0213531 A1 | 8/2009 | Berggren |
| 2009/0229194 A1 | 9/2009 | Armillas |
| 2011/0090633 A1 * | 4/2011 | Rabinovitz ............. G06F 1/184 361/679.31 |
| 2011/0179722 A1 | 7/2011 | Schulz et al. |
| 2011/0209321 A1 | 9/2011 | Kilibarda et al. |
| 2012/0013227 A1 | 1/2012 | Josten et al. |
| 2012/0066985 A1 | 3/2012 | Bachorz et al. |
| 2012/0101627 A1 | 4/2012 | Lert |
| 2012/0147552 A1 | 6/2012 | Driggers |
| 2013/0227136 A1 * | 8/2013 | Sturgeon ................. G06F 1/206 709/224 |
| 2014/0025968 A1 * | 1/2014 | Khuti ...................... G06F 1/206 713/320 |

FOREIGN PATENT DOCUMENTS

| | | |
|---|---|---|
| EP | 0821457 B1 | 10/2001 |
| EP | 1439622 A1 | 10/2011 |
| RU | 2219630 C1 | 12/2003 |
| WO | 0052799 A1 | 9/2000 |

OTHER PUBLICATIONS

Timothy P. Adams, Modular Substations: Breaking the Industry Mold, Electric Light and Power, vol. 82, Issue 5, Jul. 1, 2004, http://www.elp.com/elp/en-us/index/display/elp-article-tool-template.articles.electric-light-power. volume-82.issue-5.departments. transmission-distribution.modular-substations-breaking-the-industry-mold.html.

Power Distribution Center Buildings / Enclosures, JoaQuin Manufacturing, Sep. 24, 2013, http://enclosures.joaquinmc.com/item/all-categories/power-distribution-center-buildings-enclosure/item-1003?&forward=1# .

Substation Buildings / Enclosures, JoaQuin Manufacturing, Sep. 24, 2013, http://enclosures.joaquinmc.com/item/all-categories/substation-buildings-enclosures/item-1002?&forward=1# .

Modular Package Transformer Substations BKTP, The Ural Company, Sep. 24, 2013, http://en.uztt.ru/bktp.

Koch, W., Integrated Substation Looks Like One RTI to Dispatchers, Electrical World, vol. 209, Issue 12, Dec. 1, 1995, http://www.osti.gov/energycitations/product.biblio.jsp?query_id=1&page=0 &osti_id=171391.

MUW—Modular Substations: The Flexible Concept for Economic Substation Solutions, ABB Power Distribution, http://www.abb.com.

Marking-Camuto, R. et al, Modular Substation Offers Easy Installation, Lower Costs, Apr. 2005, http://www.cooperindustries.com/content/dam/public/powersystems/resources/library/100_Promotional/B10006019.pdf.

Control Centers—Electrical Enclosures, AZZ.com, http://www.azz.com/electrical-and-industrial-products/control-centers.

Containerized Power Systems, Drop Box, http://www.dropboxinc.com/products/containerized-grid-stabilization-power-systems/.

Equipment Rooms, MTE, http://www.mechtool.co.uk/downloads/MTE_Modular_%20Project_Experience.pdf.

Eptcon P & C / Modular Building Design, EPTCON Ltd., http://www.eptcon.compc.modular.htm.

Expandable Modular Buildings, Pac-Van Inc., http://www.pacvan.com/fast-buildings.

Packaged Modular Sub-Stations, Switchgear & Instrumentation Ltd., Jun. 2002.

Atanackovic, D. et al., A New Tool for Substation Design, IEEE Transactions on Power Systems, Nov. 4, 1998, pp. 1500-1506, vol. 13 No. 4.

* cited by examiner

MODULAR SUBSTATION PROTECTION AND CONTROL SYSTEM

CROSS-REFERENCE TO RELATED APPLICATIONS

This application claims priority to U.S. Provisional Application No. 61/661,707, filed Jun. 19, 2012, which is incorporated by reference as if fully rewritten herein.

TECHNICAL FIELD

The invention relates to a modular system of structures that controls the flow of power supply within an electric substation. More particularly, embodiments of the invention relates to a method of converting any power substation design layout into a modular protection and control system that is built into a plurality of modular structures, having pre-tested modular protection and control equipment.

BACKGROUND

Development, expansion and upgrading of electrical distribution networks is a necessary yet costly endeavor for companies that distribute electricity to consumers. When such a company becomes aware of a need for the development, expansion or upgrading of an electricity distribution network a great deal of preparation must be undertaken before the network can be expanded. Specifically, it must be determined how the new or upgraded service will be integrated into the existing network, if in existence. In addition, a protection and control ("P&C") scheme needs developed for the new assets (circuit breakers, transformers, etc.).

Existing electricity distribution networks have permanent buildings in place to monitor and control their assets. When expanding into a new geographic region, there are no such structures. Thus, a permanent structure must be purchased and retrofitted for the new purpose. Either option creates considerable cost and requires relying on local contractors who may or may not be familiar with the particular needs and business practices of the electricity distributor.

Traditionally, power utilities design P&C systems tailored around each piece of major equipment (i.e, transformer, circuit breaker, capacitor, transmission line, etc.) in a substation. The traditional methodology was efficient for smaller, less complex transmission networks and required a small knowledge-based workforce to commission and maintain the system, although it did require time consuming field integration and installation period. As transmission networks have expanded in complexity and project volume, as well as a greater demand on availability and reliability being placed on the system, the traditional method is falling short. In addition, mergers and acquisitions between utility companies, and the addition of networks has only added to complexity and challenges facing P&C engineers working to install new systems or to retrofit or upgrade existing systems. Accordingly, the knowledge-base required to maintain the complexity of each system has increased substantially, as every company and network carried over 100 years of unique practices, processes, and methodologies.

The traditional method to get a substation control building operational also requires working around a stringent transmission system outage window mostly driven by regulatory governing bodies. This requires a complex coordination among all stakeholders planning, engineering, operations, field engineering, etc., within an organization to effectively execute the P&C asset installation and replacement project on time. However, the traditional methodology is no longer feasible. This shift in utility business environment is driven largely by a need to address the aging infrastructure, the future of reliability compliance, grid security, remote monitoring, increased penetration of supervisory control (SCADA) required either the over-expansion of the organization or the introduction of innovative methods.

Moreover, this scenario falls victim to the industry problem of "over-engineering" an original P&C asset structure. That is, previously, companies with P&C assets had to project potential P&C needs as much as 40 years out and purchase and design their assets to meet this estimated need—often resulting in significant upfront costs and wasted assets where the demand never reached these projections. This approach was ineffective as it was easy to over/under-engineer for anticipated future expansion. Many times over-engineered assets would go unused as future expansion was never realized. Also, under-engineered assets could not support future expansion and new buildings would need to be installed, or costly renovations would be needed for the original structure. Consequently, there is a need for a substation that can bridge new and existing technologies, is easily expandable, and provides for a uniform implementation of P&C schemes.

SUMMARY

Exemplary embodiments of the inventive concept described herein provide for a modular protection and control (P&C) system within a substation that eliminates the need to individually tailor new P&C systems for new power equipment within substations, while still providing the flexibility to work with any existing substation design layout ranging from 12 kV(LV)-765 kV(EHV) across a broad range of technologies. The modular design package of the inventive concept is able to facilitate and expedite the design of new power substations ("greenfield") and also supports all existing and legacy power substations ("brownfield"). Exemplary embodiments reduce engineering, design, and construction lead time for all phases of the substation construction. The exemplary embodiments also reduce installation time of P&C systems within a substation to minimize the impact of regional transmission outage windows needed for construction. The exemplary embodiments streamline the material requisition process by eliminating the time required for custom designs and assist in emergency scenarios where material and designs are needed quickly.

A feature of the modular P&C system is the drop-in control module (DICM), a pre-manufactured modular substation control structure that is pre-wired and pre-tested with all P&C assets prior to onsite delivery. Upon delivery, only the integration of the building to the electrical substation yard equipment (transformer, circuit breaker, etc.) is needed. Everything contained within the structure is already tested and commissioned.

The modular structure of the present invention provides for a very flexible arrangement in that once the structure has been installed onsite the building modules can then be connected thereto in the desired number and fashion. If there is a demand for more structure modules these can be simply added without significant delay or the need for demolition and reconstruction for expansion. Similarly, removal of a particular structure module is also a simple operation. Moreover, little or no foundation preparation is required.

Disclosed embodiments provide an expandable platform where a substation control structure is first installed with a drop-in base module. The base module houses only the required P&C assets and the core P&C job requirements for the substation. When new or additional capacity is needed on the same substation footprint, a drop-in expansion module, manufactured in the factory to meet the specifics of that project with needed P&C assets, can be shipped at the site and integrated quickly and efficiently to the existing base module.

Once built and installed, the structure can be later expanded or reconfigured to meet changing demands in short order. In addition, the structure can be relocated in whole or in part with relative ease.

The structures of described embodiments differ from previous prefabricated structures in that they are manufactured in their entirety in modular format together with completed interiors. The structures are comparatively lightweight, are designed and tested to withstand extreme weather conditions and require only limited foundations. The range of sizes allows for all buildings to be assembled from factory produced units.

Every DICM starts with a base module. The intention of this base module is to house all the essential P&C equipment required within the substation (station battery, battery charger, DC/AC panelboards, RTU, and SDR etc.) and a number of modular P&C panels. As the need arises for the future expansion or replacement of P&C assets in the substation, the DICM can be expanded with the addition of a properly selected expansion module. The expansion module mainly contains modular P&C panels and termination cabinets. Additionally, the use of expansion modules with a set of modular P&C panels eliminates a common issue with conventional expansion of assets. The expansion and/or replacement of modular P&C panels was, traditionally, piecemeal creating a site with panels of mismatched vintages. Whereas here, capacity can be quickly upgraded with the installation of an expansion module and all modular P&C panels, being replaced in groups will minimize large equipment outages associated with the removal of old P&C panels.

Disclosed embodiments address several problems associated with the conventional substation control building approach: the modular DICM is a pre-manufactured modular substation control structure design that is pre-wired and pre-tested with all P&C assets prior to onsite delivery. Upon delivery, only the integration of the structure to the electrical substation yard equipment (transformer, circuit breaker, etc.) is needed. Everything contained within the structure is already tested and commissioned. Whereas conventional onsite constructed substation control buildings ("stick-built") rely heavily on regional construction resources. The problem of over/under-engineering of the substation control building for the P&C asset installation for the life-span of the substation rather than addressing its immediate need. Disclosed embodiments provide an expandable platform where a substation control structure is first installed having a base module. The base module houses only the required P&C assets and the core P&C job requirements for the specific project. When a new project materializes on the same substation footprint, an expansion module, manufactured in the factory to meet the specifics of that project with needed P&C assets, can be shipped to the site and integrated quickly and efficiently to the existing base module. The hurdle of long transmission system outage windows is solved by the disclosed embodiments because everything contained within the modular DICM structure is already tested and commissioned in a factory environment. This drastically reduces the lead time from weeks to days to have a substation control structure operational.

Disclosed embodiments effectively integrate safety, efficient operation and regulatory compliance into one design approach. Close attention is paid to the ergonomics (such as the location, proximity to other energized equipment of the DICM) to maximize the safe and efficient operation of the equipment installed.

Further, the cost effectiveness of the DICM affords users the ability to further address regulatory compliance requirements related to P&C assets (NERC's future direction), reduce significant transmission system outage windows, minimize the use of regional construction resources, and provide a more prudent means of splitting overall cost of the substation control building over multiple financial sponsors. Moreover, the disclosed embodiments offer significant financial advantages and improved efficiencies, including:

Half the total installed cost of conventional construction for a substation control building, lower modular panels integration cost, onsite P&C technical savings ranging from 20%-30% and P&C wireman control savings of 50%-75%.

Lower operational and maintenance expenses because new P&C equipment extends the testing and maintenance frequency from 6 years to 12 years.

DICM modules designed and constructed for specific projects provide creative funding solutions, enabling a "pay as you go system" for operating companies to pay for their part of the P&C assets expansion rather than paying upfront for constructing substation buildings based on anticipated future needs.

Enhances transmission's ability to execute the capital work plan by reducing transmission system outage times from months to weeks for installation.

DICM modules are factory acceptance tested and checked all the way to the terminal cabinets by qualified technicians before and after delivery.

Independent verification at the factory of acceptance testing builds human performance into the P&C commissioning process and contributes to shorter wiring/commissioning times onsite.

The modular DICM concept also is designed to implement a standardized communication platform (IEC-61850) using fiber optic cable. This eliminates serial, hard-wired copper connections and enables multiple devices to be tied together through the optic cable.

The modular DICMs come in all different sizes (base and expansion) and can be sized accordingly to fit the specific needs at the time of original installation. As a modular based platform, the DICM can be used to provide a demarcation between P&C assets that could be owned by more than one owner.

Disclosed embodiments relate to a "plug and play" or "drop-in" control module for electrical power delivery. When expanding into new power delivery areas, expanding existing power delivery assets, or upgrading aging power delivery assets, lengthy delays and power outages are necessary. Often, power delivery companies must schedule these outages and this scheduling (due to cost, regulations etc.) may preclude upgrading equipment for months or even years before the outages can be scheduled.

Disclosed embodiments describe a modular electrical substation control structure including: a preassembled, portable base module, with a first vertical wall member including a doorway; a second vertical wall member; a roof extending across the top of the first and second vertical wall members; and protection and control devices housed within the base module adapted for operational connection to an existing electrical network, including a plurality of modular panels, and a control station battery.

Disclosed embodiments describe a method of constructing a modular electricity substation control structure. Although the construction is modular, the resultant substation may be permanent. The method includes the following steps: preparing a substantially level area for subsequent erection of the control structure thereon; delivering a portable base module with pretested protection and control assets to the level area. The base module comprising a base, a plurality of vertical wall members extending upward from the base, at least one of the vertical wall members including a removable wall section adapted for reversible attachment to the base module for quick removal to facilitate attachment of an expansion module, a roof extending across the top of the vertical wall members; and pre-tested protection and control assets housed within the structure adapted for swift integration into an existing electricity network, and integrating the base module into the electricity distribution network.

In an embodiment, a base module comprises a standard footprint and a predetermined number of modular panels, a predetermined number of batteries, a series of wire trays above the modular panels for training the control cables and integrating the panels into an existing power delivery network.

In addition to the modular building and expansion thereto described above, the P&C assets within the case module and expansion modules are also modular including the modular P&C panels and modular P&C assets. Further, to eliminate the need for unique P&C assets, the modular P&C assets according to the inventive concept are standardized. To select the proper modular P&C asset the inventive concept provides for a modular asset selection system that may either be performed manually or performed using a computer device.

The modular P&C asset selection system begins with a one-line diagram providing the needs of the substation to be constructed, expanded, or upgraded. An analysis is conducted of the one-line diagram to identify the protection and control zones requiring P&C assets. A computer database on a computer device can be configured to include the relevant data for selecting the proper modular P&C asset based on the identified protection and control zones. This information includes: protection schemes; control schemes; design modules for the protection and control schemes; design modules for the metering, SCADA, and record/automation. The database also includes criteria for identifying the proper design modules. Once a design model has been identified the additional criteria can be used to identify specific modular P&C assets associated with the design modules. In this mode, the modular P&C assets can be thought of as child design modules of the parent design modules. The computer device can be configured to identify all possible protection and control schemes as well as all design modules associated with the control schemes, protection schemes, metering, SCADA, and automation. The computer device can also be configured to present criteria for selection of the modular P&C assets. Once all modular P&C assets have been identified, they may be retrieved or built. These modular P&C assets are already designed and tested, eliminating the need to uniquely design a P&C solution.

After selecting the appropriate modular P&C assets they may be connected to a relay plate for installation into a standardized modular panel. In this manner, the modular panels simply act as a rack for the insertion of different modular P&C assets and provide connections both electrically and to the LAN network of the substation. This modular feature allows replacement of damaged modular P&C assets, upgrades, or expansion by simply removing the modular P&C asset from the modular panel and adding a new modular P&C asset of the same or different functionality. The "plug and play" features of the plates and panels allows for easy integration with existing equipment and allows for easy upgrades as improvements are made.

Together the expandable building modules, expansion modules, standardized modular panels, and standardized modular P&C assets, provide for an improved P&C solution versus traditional methodology.

BRIEF DESCRIPTION OF THE DRAWINGS

A better understanding of the exemplary embodiments of the invention will be had when reference is made to the accompanying drawings, wherein identical parts are identified with identical reference numerals, and wherein.

DETAILED DESCRIPTION

Figure 1:
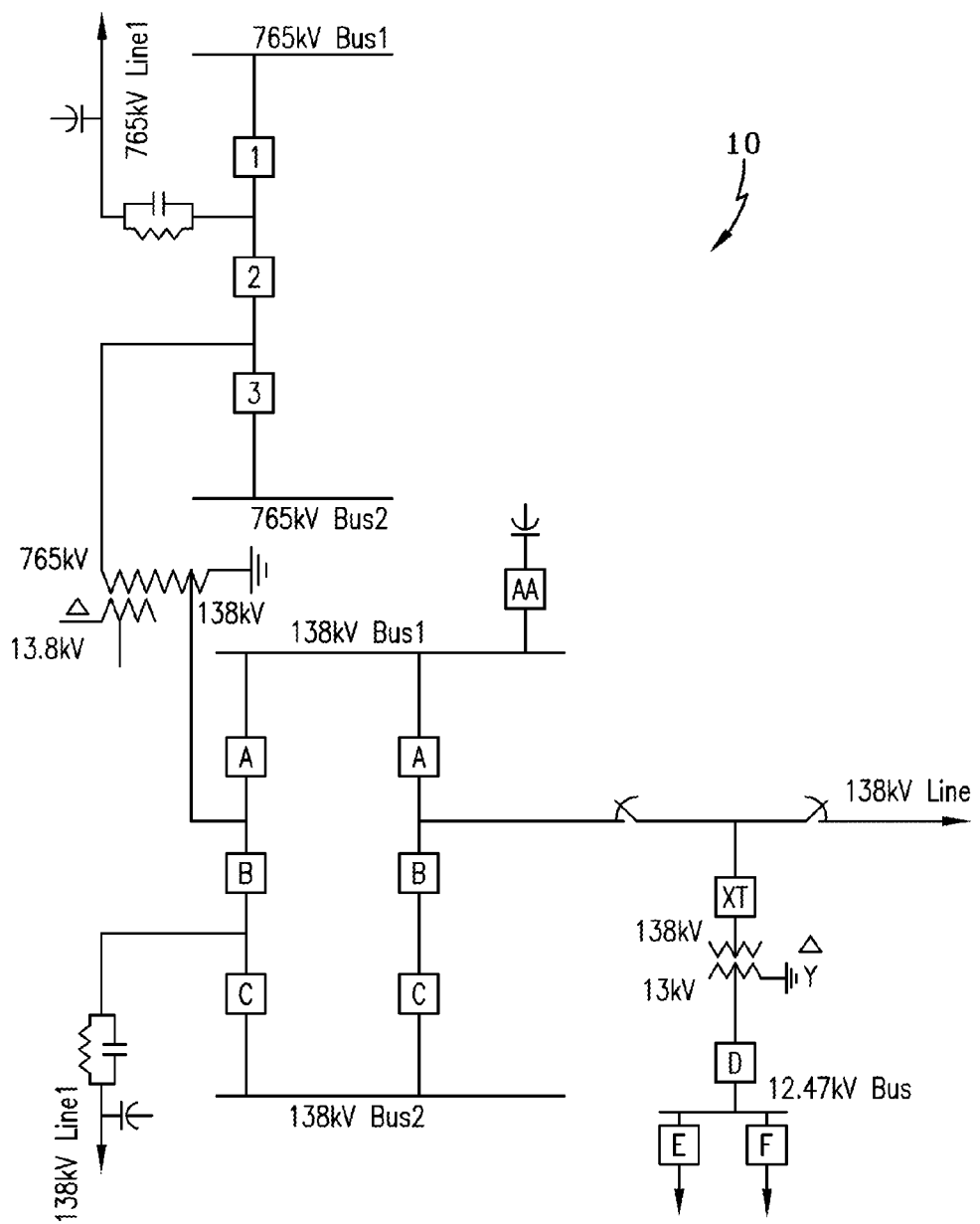
FIG. 1 is an exemplary one-line diagram for a power substation.

The modular substation protection and control system according to the inventive concept is a multi-step approach to provide a modular solution to the construction or expansion of power substations. To provide a complete modular solution, the assets within the power substation are modular in design allowing replacement of existing assets or components without the need to replace entire panels as traditionally required. The modular P&C assets are pre-wired and pre-tested to reduce the time needed for design and installation. The modular P&C assets also have the capability to be integrated into existing legacy assets avoiding the need to construct a new power substation. Furthermore, the structure itself is of a modular construction allowing for expansion of the power substation, again avoiding the need to construct a new power substation.

To expedite the process of constructing a new power substation or upgrading or expanding an existing power substation, the modular P&C assets may be pre-constructed and shelved for easy retrieval and installation. In other exemplary embodiments, the modular P&C assets may be pre-packaged plans for manufacturing the individual modular P&C assets. The use of standardized modular P&C assets eliminates the need for traditional methods wherein each power substation is individually tailored and unique. Furthermore, once the modular P&C assets have been identified a standardized modular building will also be utilized decreasing the cost and time to build a power substation.

To provide a new modular substation, including all the modular P&C assets and building materials the project typically begins with a "one-line" diagram. A one-line diagram is a simplified notation for representing a power system. In one-line diagrams electrical elements such as circuit breakers, transformers, capacitors, bus bars, and conductors are shown by standardized schematic symbols. The elements on the diagram do not represent physical size or location of the electrical equipment, but it is a common convention to organize the diagram with the same left-to-right, top-to-bottom sequence as the switchgear or the apparatus represented. The one-line diagram can be for any power substation design ranging from 12 kV to 765 kV.

Generally, the inventive modular substation design includes the following steps. A one-line diagram is produced for a new power substation or an upgrade or expansion of an existing power substation. The one-line diagram is then analyzed to identify the protection zones and to determine the modular P&C systems required for the power substation. Once the P&C systems are analyzed the type of protection scheme is then determined based on the protection zones in the one-line diagram. After the protection schemes are determined then design modules are selected, also referred to as parent design modules. From the particular parent design modules are selected individual modular P&C assets or child design modules based on the specific needs such as frequency, voltage and other factors. After the modular P&C assets have been identified a user may then be directed to a location to retrieve the pre-wired, pre-tested modular P&C assets. In other exemplary embodiments, once the modular P&C assets have been identified a user may be presented with engineering drawings needed to construct the individual modular asset. After all the modular P&C assets have been identified, modular building material may be identified to a user. The modular building materials include the modular structures described herein. After all the components of the modular power substation have been identified the materials may be packaged and shipped for construction onsite. Since the modular P&C assets are standardized, pre-wired and pre-tested construction of the building and installation of the assets therein is substantially easier than traditional methods.

Figure 2:
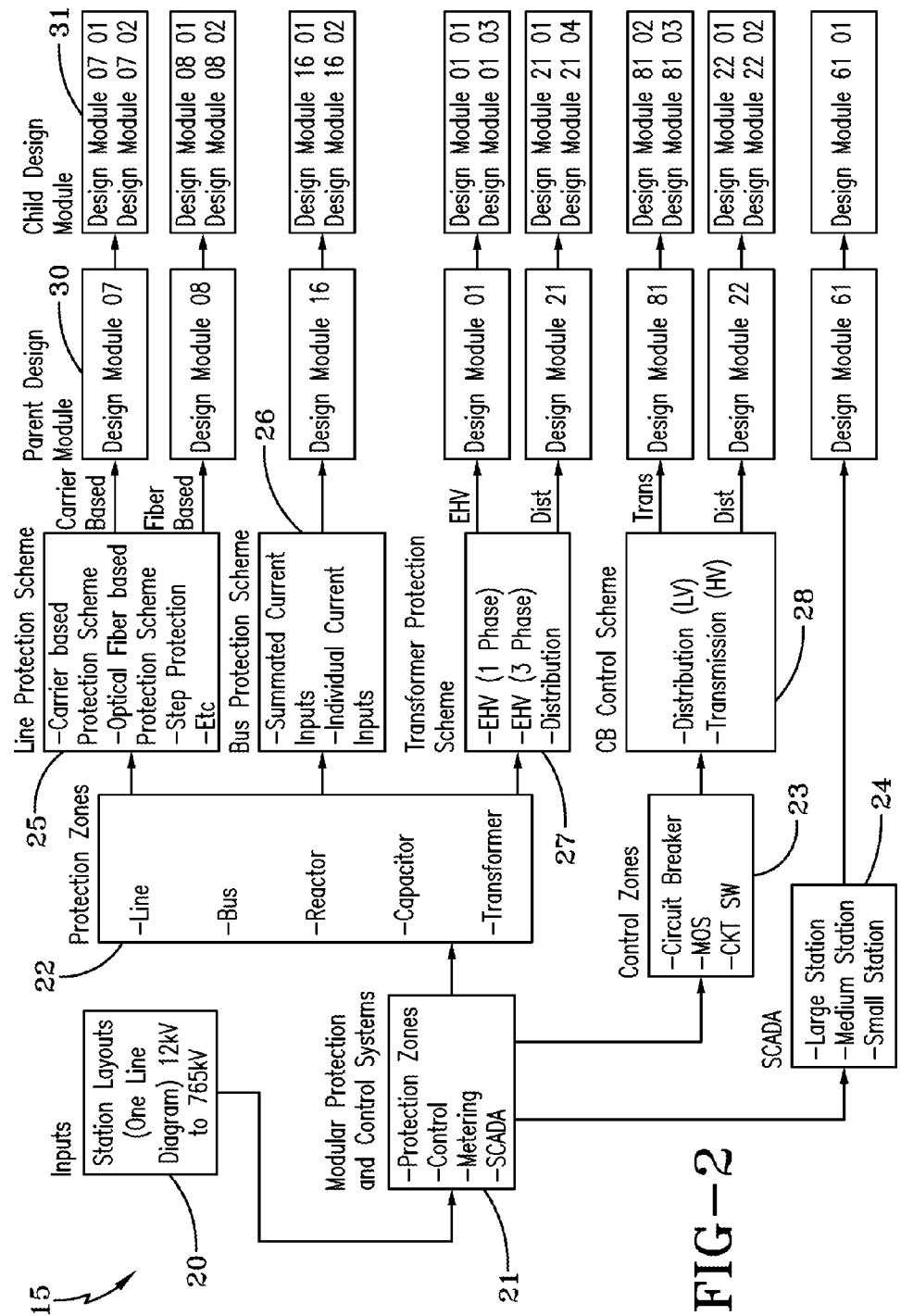
FIG. 2 is a flow chart of the exemplary embodiment depicting the modular P&C asset selection system.
Figure 3:
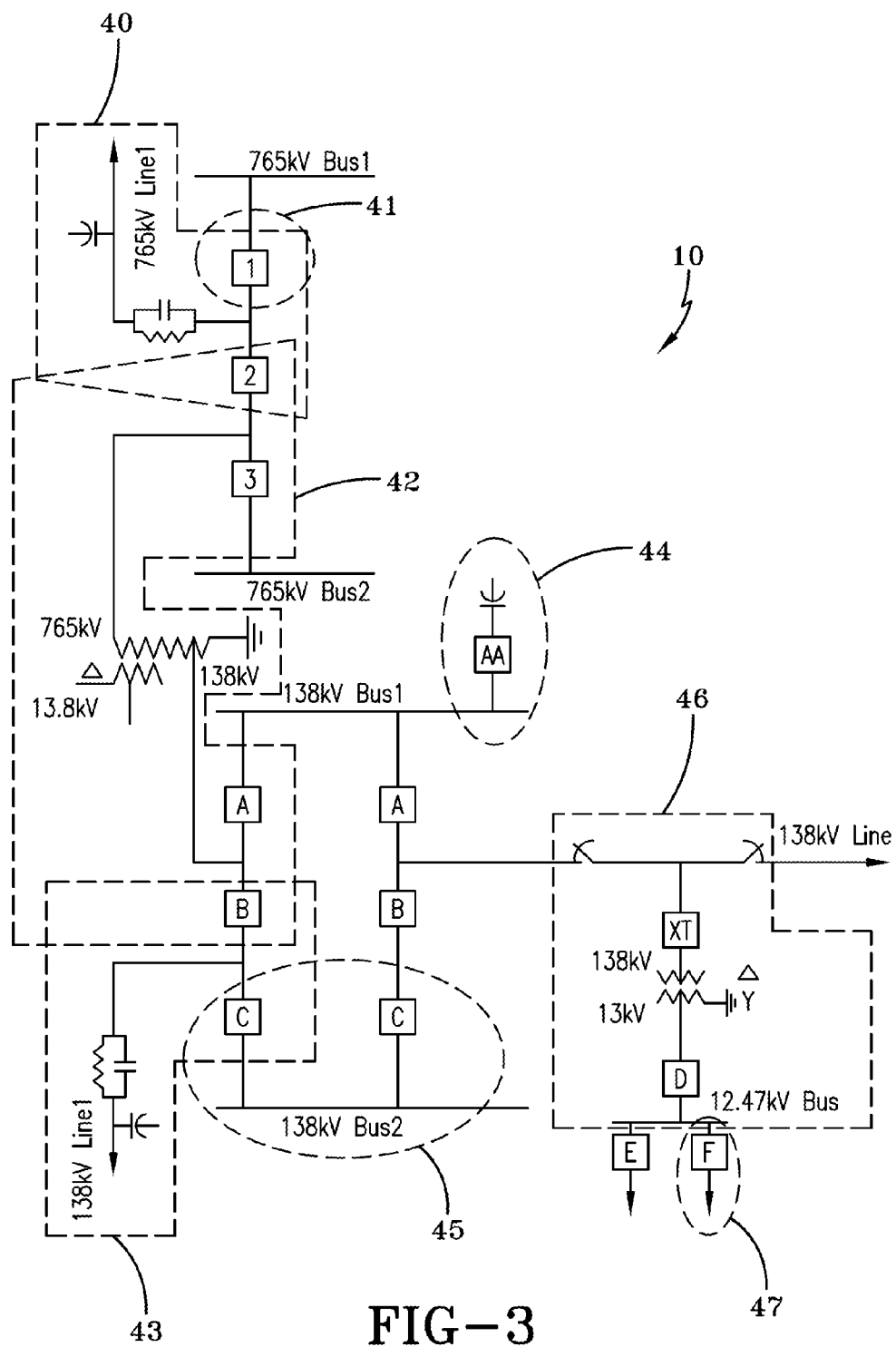
FIG. 3 is the exemplary one-line diagram of FIG. 1 with protection and control zones identified for major equipment.

FIGS. 1-3 provide an example of the modular asset selection system 15 for an exemplary power substation. The process begins with a one-line diagram 10 for a power substation as illustrated in FIG. 1. As discussed above, the one-line diagram 10 provides the power flow needs of the modular substation. A flow diagram is provided in FIG. 2 for the process of selecting modular P&C assets. As illustrated in FIG. 2, the one-line diagram 10 is the input 20 for the modular asset selection system 15 stored on a computer. The modular asset selection system 15 has a database of modular protection and control systems 21, which is further subdivided into categories, including, but not limited to, protection zones 22, control zones 23, metering (not shown in the diagram), and supervisory control and data acquisition ("SCADA") 24.

After a category is selected, each of the identified categories is further subdivided into individual components and controls. The protection zone 22 category is divided into individual components, including, but not limited to, line, bus reactor, capacitor, and transformer. The control zone is divided into individual control zones for circuit breakers, motor operated switch (MOS), and circuit switcher (CKT SW). The SCADA category is further divided depending on the size of the power substation. Due to the standardization of the modular P&C assets, the SCADA can be simply divided into small, medium and large power substations.

A user is then prompted to select from one of the above described divisions within the categories. Once selected, the user is presented with protection schemes for each component. Accordingly, the database is divided into protection schemes, including, but not limited to, line protection schemes 25, bus protection schemes 26, reactor protection schemes (not shown), capacitor protection schemes (not shown), and transformer protection schemes 27. The control zone 23 is further divided into control schemes for circuit breakers control schemes 28, MOS control schemes (not shown), and CKT SW control schemes (not shown). For each of the schemes, the user is presented with options for individual design modules based on the needs of the power substation.

For example, as shown in FIG. 2, the user is prompted to select a line protection scheme 25 based on whether a carrier based protection scheme, an optical fiber based protection scheme, step protection scheme is needed. Although the line protection scheme 25 lists three specific criteria, it should be known to those skilled in the art that other criteria may also be implemented based on the needs of the power substation. Likewise, the bus protection scheme 26 has criteria listed therein, including, but not limited to, summated current inputs and individual current inputs. The transformer protection scheme 27 also has criteria including EHV (1 Phase), EHV (3 phase), and distribution. The control scheme 28 also provides the user with criteria that include, but are not limited to, distribution (LV) and transmission (HV). The above stated criteria are used as examples and other criteria may be added to the database depending on the needs of the power substation and advancement in technology.

Once the user has selected criteria from the individual schemes 25, 26, 27, 28 the user is then presented with the design module 30. As indicated, a design module is present for each criteria selected from the schemes 25, 26, 27, 28. After the user has been presented with the design module 30, the user is again prompted to select from an additional set of criteria to select the modular asset 31 or child design module. This additional level of criteria is based on the individual requirements of the power substation, including, but limited to, voltage, frequency, and manufacture of the existing components. After the user selects the additional criteria, the user is presented with the modular asset's 31 identification and possible shelve location where the modular asset 31 is stored, along with other information such as, operating notes, logic diagrams, schematics, wiring diagrams, control panel assembly prints and bill of material, one-lines for the asset, station standard reference explaining the purpose for the scheme and how to program the relays, and relay setting templates.

Once the size of the substation has been determined, the user then selects the appropriate size from the SCADA 24 category and a design module 30 is presented. Again the user is presented with criteria for selecting the modular asset 31 and the individual SCADA modular asset 31 is provided. Once all modular P&C assets 31 have been identified, they can be packaged for transport to the location for installation in the power substation. As discussed above, the modular P&C assets 31 are pre-wired and pre-tested providing a standardized solution for a power substation.

FIG. 2 provides an example selection process for the design modules 30 and modular P&C assets 31. As stated above, additional design modules 30 and modular P&C assets 31 may be provided in the selection database. Some additional design modules 30 and modular P&C assets 31, include, but are not limited to:

Design Module—Transmission and Subtransmission Transformer Protection
    Modular Asset—3 Phase Transformer Differential and Tertiary Protection
    Modular Asset—1 Phase Transformer Differential and Tertiary Protection Design Module—UHV Transmission Line Protection
    Modular Asset—UHV Transmission Line with System 1 DCB, System 2 DCB and Backup Step Distance Design Module—HV Transmission Line Protection
    Modular Asset—HV Transmission Line with System 1 DCB & System 2 Step Distance
    Modular Asset—HV Transmission Line with System 1 DCB, DTT & System 2 Step Distance
    Modular Asset—HV Transmission Line with System 1 DCB, DTT & System 2 DCB Design Module—HV Transmission Line Protection
    Modular Asset—HV Transmission Line with System 1 & System 2 Current Differential
    Modular Asset—HV Transmission Line with System 1 Current Differential & System 2 Mirrored Bits Design Module—Subtransmission Line Protection
    Modular Asset—Subtransmission Line with System 1 & System 2 Step Distance
    Modular Asset—Subtransmission Line with System 1 DCB & System 2 Step Distance Design Module—Subtransmission Line Protection
    Modular Asset—Subtransmission Line with System 1 & System 2 Current Differential Design Module—Transmission Bus Protection
    Modular Asset—Transmission Bus Protection with System 1 & System 2 Current Summation Scheme
    Modular Asset—Transmission Bus Protection with System 1 & System 2 Low Impedance Scheme Design Module—Transmission Capacitor Bank Protection
    Modular Asset—Transmission Cap Bank Protection—Line
    Modular Asset—Transmission Cap Bank Protection—Bus Design Module—Distribution Transformer and LV Bus Protection
    Modular Asset—Fused Distribution Transformer
    Modular Asset—Distribution Transformer W/LB SW, W/Tr. Diff.
    Modular Asset—Distribution Transformer W/LS CB Design Module—Distribution Feeder and Capacitor Bank Protection
    Modular Asset—Distribution Feeder Design Module—Metering
    Modular Asset—InterCompany Metering
    Modular Asset—IntraCompany/Stateline Crossing Metering Design Module—SCADA, DMS, Communication
    Modular Asset—RTU, Communications & Alarms Design Module—DFR, Data Repository, Automation
    Modular Asset—Station PC w/Monitor, Keyboard and Software
    Modular Asset—Disturbance Monitoring Equipment (DME)

Design Module—CB Control and Mechanisms
    Modular Asset—UHV Transmission Single Breaker Control
    Modular Asset—HV Transmission Breaker & Half Control
    Modular Asset—HV Transmission Single Breaker Control (Upper Plate)
    Modular Asset—HV Transmission Single Breaker Control (Lower Plate)

Directing attention to FIG. 3 wherein the one-line diagram 10 of FIG. 1 is shown after the P&C zones have been identified, as exemplar of the inventive concept described herein. As illustrated, the one-line diagram 10 has been divided into zones that correspond to individual design modules 30. Specifically, the following necessary design modules 30 have been identified: UHV transmission line protection 40; transmission circuit breaker protection and control 41; UHV transformer protection 42; transmission line protection 43; transmission cap bank protection and control 44; transmission bus protection 45; distribution transformer and LV bus protection and control 46; and distribution feeder protection and control 47. The identification of design modules 30 on the one-line diagram 10 may be created by a computer program or a user. By identifying the design modules 30 on the one-line diagram 10, the results can be cross-checked to ensure that the needs of the power substation have been accounted for by simple visual inspection.

Figure 4A:
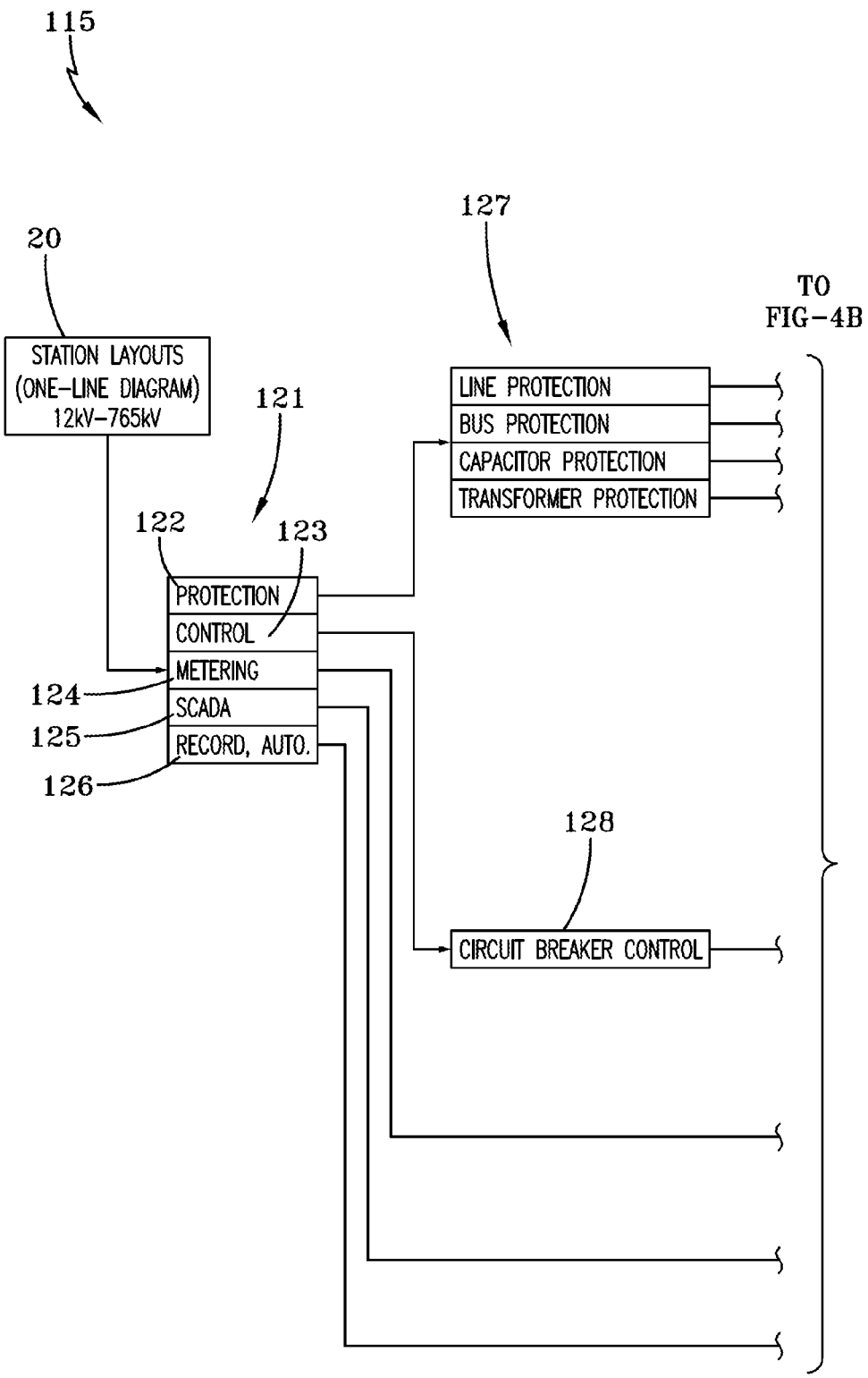
FIGS. 4A-4C are flow charts of the exemplary embodiment depicting the modular P&C asset selection system.
Figure 4B:
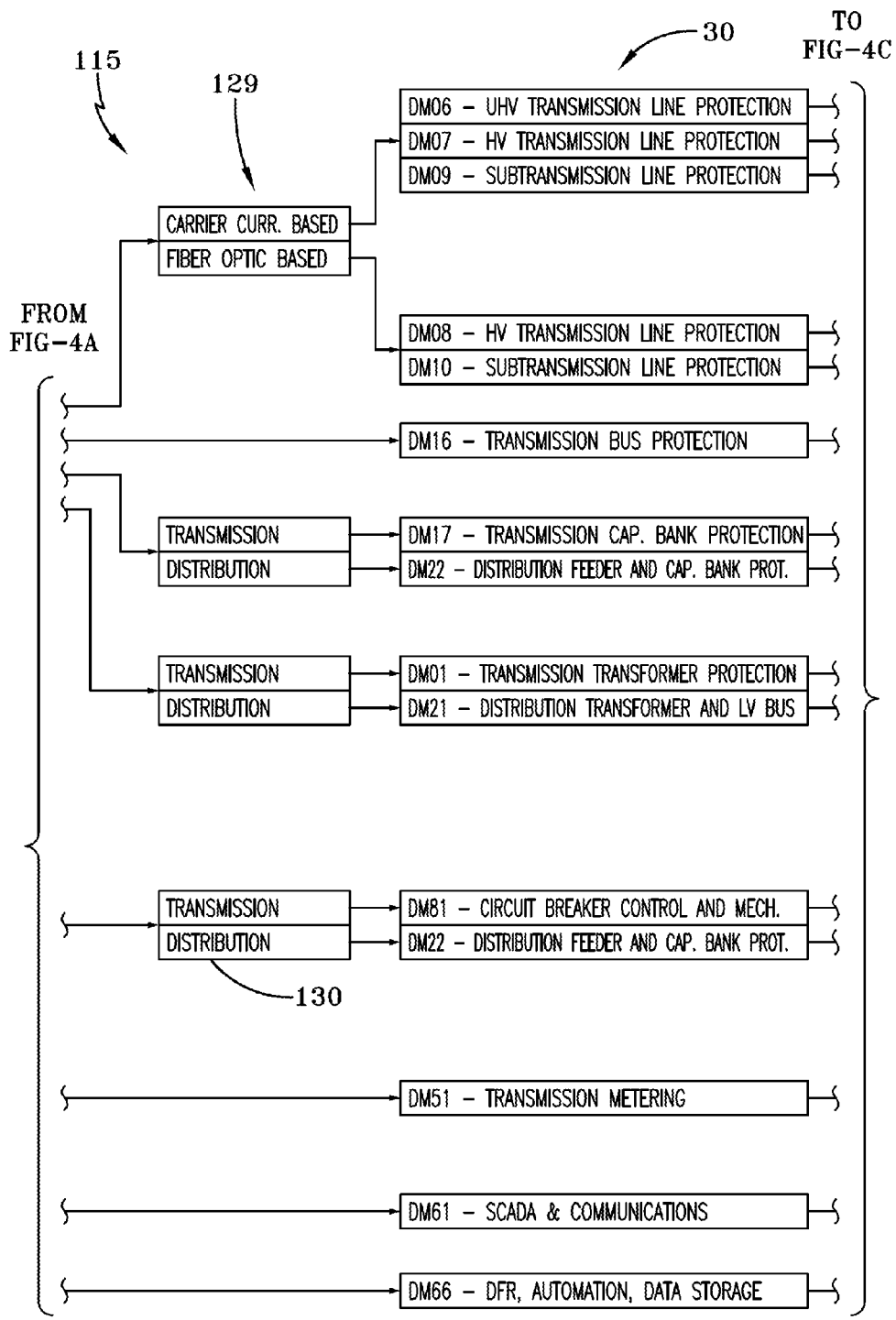
Figure 4C:
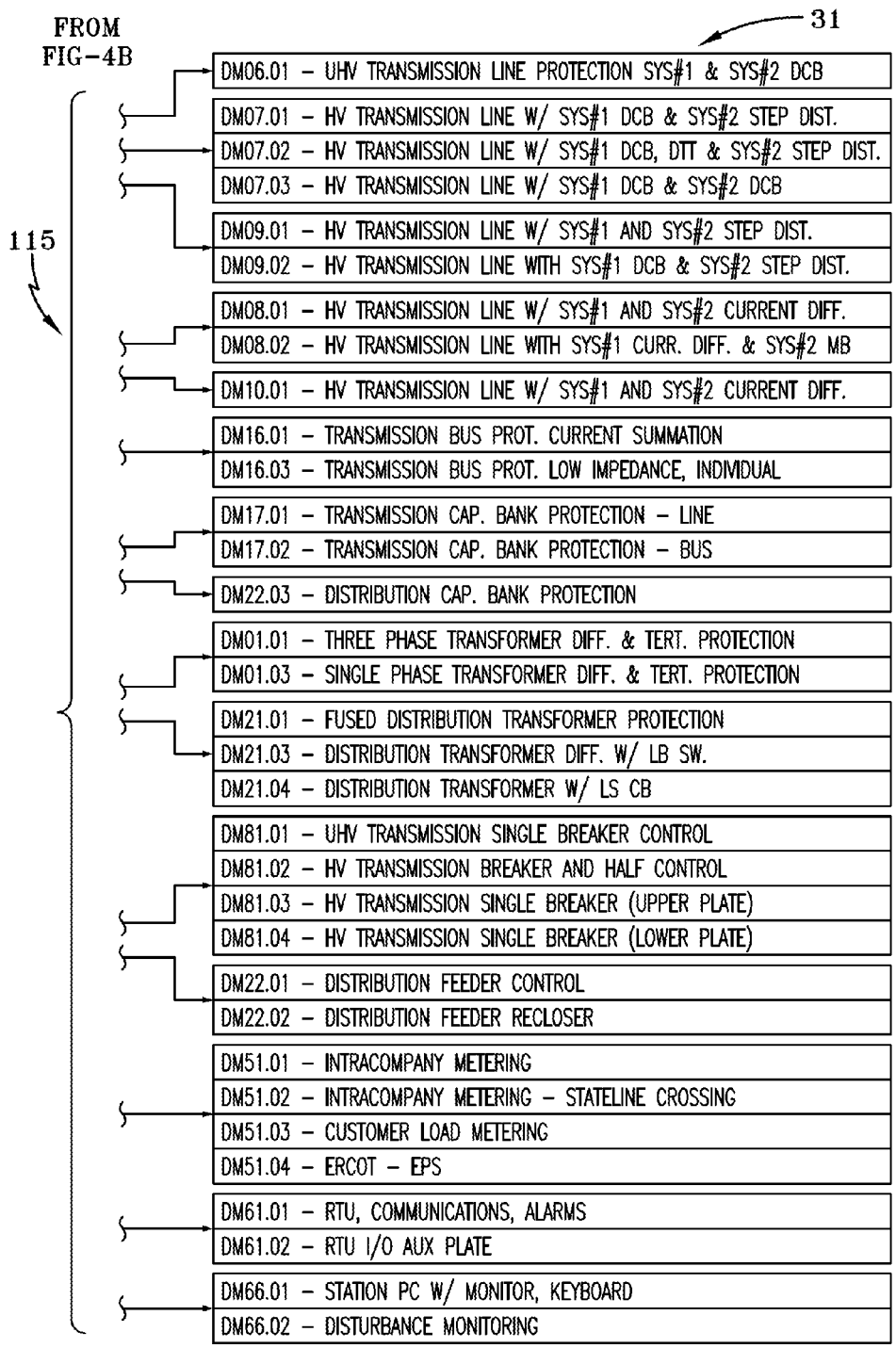

FIGS. 4A-4C illustrate another exemplary embodiment of the modular asset selection system 115 for an exemplary power substation. Like the embodiment if FIG. 2, the process begins with a one-line diagram 10 as illustrated in FIGS. 1 and 3. The one-line diagram 10 is the input 120 for the modular asset selection system 115 stored on a computer. The modular asset selection system 115 is located in the memory of a computer and has a database of modular protection and control systems 121 which is further divided into categories, including, but not limited to, protection 122, control 123, metering 124, SCADA 125, and record/automation 126.

When a user selects the protection category 122, the user is presented with individual protection components 127 that include, but are not limited to, line protection, bus protection, capacitor protection, and transformer protection. When a user selects the control category 123, the user is presented with the circuit breaker control option 128.

The user is then promoted to select one of the individual protection components 127. Once the user selects the individual protection component 127 they are directed to a database of protection schemes 129 for the individual component selected. For example, if the user selects the line component from the list of individual protection components 127, the user is presented with options for carrier current based line protection schemes and fiber optic based line protection schemes. If a user selects the capacitor component from the individual protection component list 127, the user is presented with options for transmission capacitor protection schemes and distribution capacitor protection schemes. Likewise, if the user selects transformer protection, the user is presented with protection schemes for both transmission and distribution. Similarly, once the user selects the circuit breaker control option 129, the user is presented with circuit breaker control schemes 130 that include, but are not limited to, transmission and distribution control schemes.

Once the user is in the control scheme 130 or protection scheme 129 subfolders, the user is then presented with design modules 30 for the selected protection or control schemes 129, 130. Within the design module 30 folder for each scheme 129, 130, the user is presented with selection criteria based on the individual requirements of the power substation, including, but not limited to, voltage, frequency, phase, and manufacturer of the existing components. After the user makes a selection based on these criteria, the user is presented with the modular P&C asset 31 for use in the power substation. Further information may be provide such as shelve location of the modular P&C asset 31, as well as, operating notes, logic diagrams, schematics, wiring diagrams, control panels assembly prints and bill of material, one-lines for the asset, station standard reference explaining the purpose of the scheme and how to program the relays, and relay setting templates.

When the user selects from the metering 124, SCADA 125, and record/automation 126 categories, the user is immediately presented with design modules 30 for the selected category. As discussed above, the user then selects from a set of individualized criteria and is presented with the modular P&C asset 31 meeting the criteria for the category 124, 125, 126 they selected.

Figure 5:
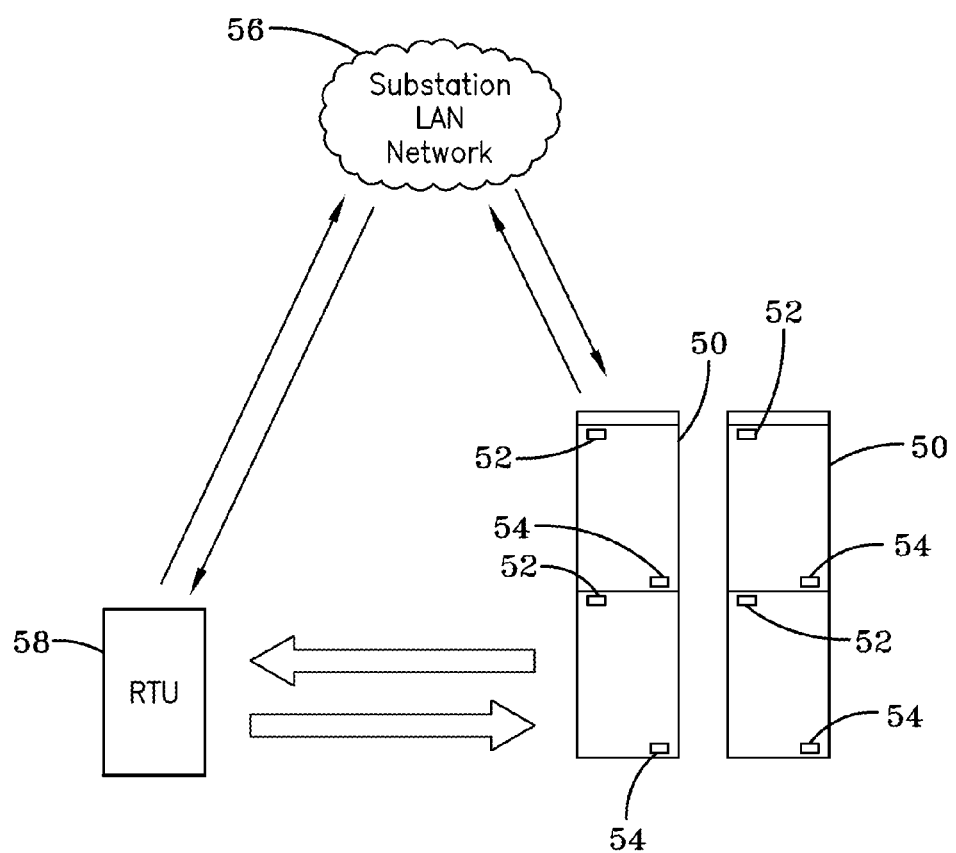
FIG. 5 illustrates exemplary embodiments of modular panels according to the inventive concept.

FIG. 5 illustrates the modular control panels or relay panels 50 that house the modular P&C assets 31. After the modular P&C assets 31 have been identified and collected, assembly of the modular panels may begin. The modular panels 50 in FIG. 5 will house two modular P&C assets 31. In other embodiments, the modular panels 50 may house any number of modular P&C assets 31. The modular P&C assets 31 provide both a network connection port 52 and an electrical connection port 54 for each modular P&C asset 31 housed therein. The network connection ports 52 allow the modular P&C assets 31 to be connected to the substation LAN network 56. The modular P&C assets 31 may be hardwired to the substation LAN network 56 or connected wirelessly. A remote terminal unit or remote telemetry unit ("RTU") 58 is also provided. An RTU is a microprocessor-controlled electronic device that interfaces the modular P&C assets 31 with the SCADA system by transmitting telemetry data. The RTU is also connected to the substation LAN network 56. The modular P&C assets 31 and the RTU 58 may communicate over the substation LAN network 56 or they may be hardwired directly to one another, or both. This communication allows for monitoring of the modular P&C assets 31. The use of the LAN network utilizing communication through RS485 and Ethernet to perform SCADA activities not only reduced the number of devices integrated as compared to traditional power substations, but also reduced a considerable amount of wiring to the RTU 58. In some exemplary embodiments, RTU 58 devices may be integrated with the modular P&C assets 31.

To reduce design cost and installation time, the modular panels 50 are standardized. This allows a variety of modular P&C assets 31 to be placed in the modular panels 50. The connection ports 52 and 54 are also adapted to allow a variety of modular P&C assets 31 to be connected thereto. This reduces the cost typically associated with individually wired relay panels found in traditional power substations.

Figure 6:
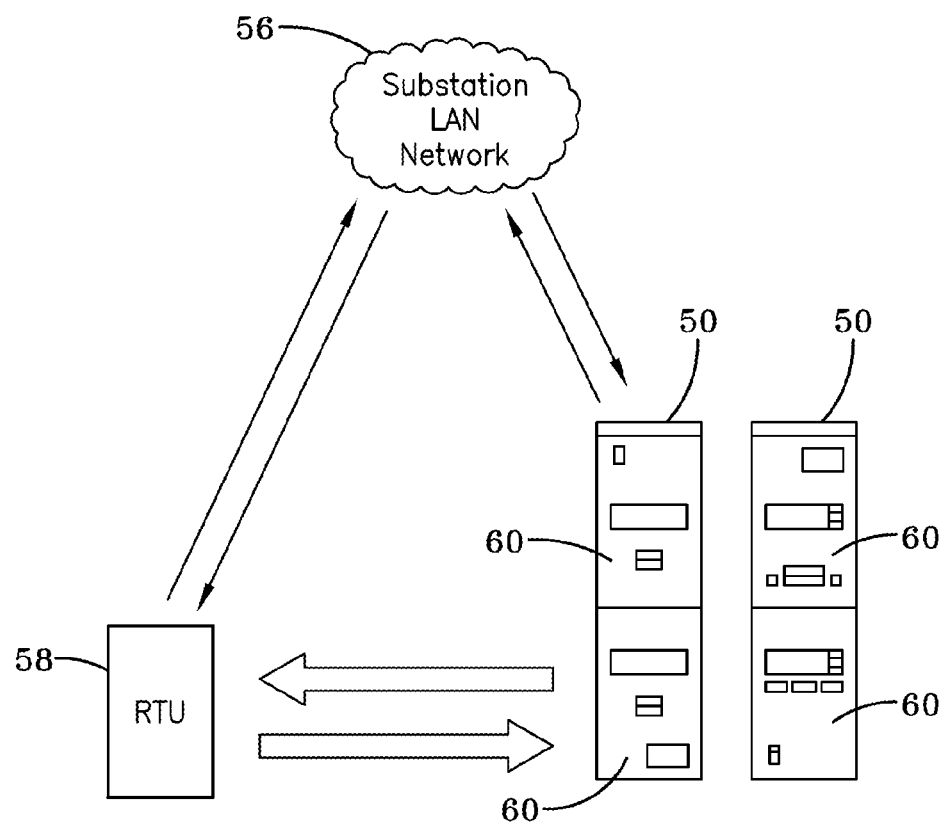
FIG. 6 illustrates exemplary embodiments of the modular panels including relay plates according to the inventive concept.

The modular panels 50 each include a plurality of relay plates 60 as shown in FIG. 6. The relay plates 60 are adapted to releasably support and electrically connect the modular P&C assets 31 to the modular panels 50. The relay plates 60 are standardized so that they may be used with a variety of modular P&C assets 31 (as discussed above). The standardization of the modular components (modular P&C assets 31, modular panels 50, relay plates 60) ensures that the modular P&C assets 31 are interchangeable within the modular panels 50. For example, a modular panel 50 may include a 1 Phase Transformer Differential and Tertiary Protection modular P&C asset 31. If the need arises, the 1 Phase Transformer Differential and Tertiary Protection modular P&C asset 31 may be exchanged for a 3 Phase Transformer Differential and Tertiary Protection modular P&C asset 31 without the need to rewire the modular panel 50. One simply removes the relay plate 60 having the 1 Phase Transformer Differential and Tertiary Protection modular asset 31 from the modular panel 50 and insert a relay plate 60 having a 3 Phase Transformer Differential and Tertiary Protection modular asset 31 associated therewith. This adds a level of "plug-and-play" functionality to power substations never before realized in traditional power substation construction. This "plug-and-play" feature increases the longevity and functionality of the modular panels 50 as well as the power substation as a whole, by allowing removal, replacement, and addition of modular P&C assets 31.

The modular features of the modular power substation also extend to the housing containing the modular panels 50 and other substation components. A base module, as shown in FIG. 7, is representative of the disclosed embodiments and contains all essential components found in electrical substation control buildings (station battery, battery charger, DC/AC panelboards, RTU 58, SDR, modular panels 50, modular P&C asset 31, etc.), removing the variable of expanding P&C systems.

Figure 7:
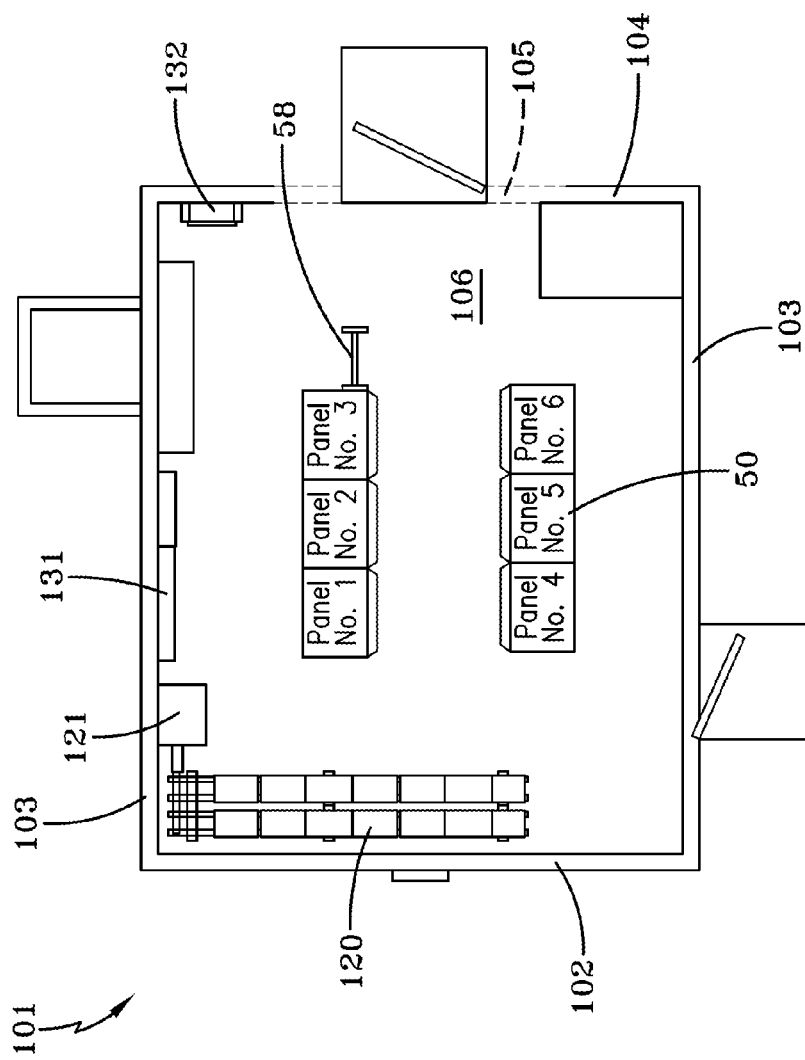
FIG. 7 is a top view of an exemplary embodiment of a base module of DICM for housing P&C systems.

FIG. 7 shows a top view of an embodiment of a base module. In the embodiment shown in FIG. 7, an exemplary base module 101 has a footprint, the footprint substantially defined by a series of vertical walls. There is a first vertical wall member 102; a pair of opposing vertical wall members 103; an expansion wall member 104, the expansion wall member including a removable wall section 105; a base 106 extending between the walls; and a roof (not shown) extending across the top of the vertical wall members. In an embodiment, the removable wall section 105 is positioned substantially in the center of the expansion wall member 104 and along a walkway created by the installed modular panels 50. The removable wall section 105 provides an open end for cooperative engagement with another structure when removed. The base module 101 may be employed in two ways, in the first, the removable wall section 105 of the expansion wall member 104 is securely fastened to the remainder of the structure by a series of fasteners such that it operates as a conventional wall; in the second, wherein expansion has been deemed necessary, the fasteners securing the removable wall section 105 are removed and the removable wall section 105 is taken out in order that an expansion module may be attached to the base module 101.

Included within the base module 101 are a set of base module protection and control assets such as modular panels 50, station battery bank 120, battery charger 121, DC panel board 131, AC panel board 132, RTU 140, modular P&C assets 31, and various environmental control devices. In an embodiment, an AC transfer switch is installed, optionally on one of the fixed wall sections of the expansion wall member. Once installed, the base module 101 is connected to the larger network and the RTU 140 facilitates communication with a central control hub. All assets are pretested to meet the demands of the network and state and federal regulations in order to minimize system outages during installation of the module 101. Further, these components define a walkway through the structure, such that a user may walk through the structure and access the protection and control assets housed therein. The walkway is such that when a substation is expanded, the walkways of the base module 101 substantially align with those of an expansion module structure, allowing access to all of the protection and control assets of the expanded structure.

Each base module includes a plurality of connection sites disposed at intervals along a perimeter of the third wall member. The connection points enable expansion modules to be connected to a base module, or alternately, for two expansion modules to be connected in a series, should the need arise. Attachment is realized by attachment apparatuses that may be secured to the outside of the structures reversibly securing the two structures together. In an embodiment, the attachment apparatus comprises a plurality of brackets and fasteners.

Figure 8:
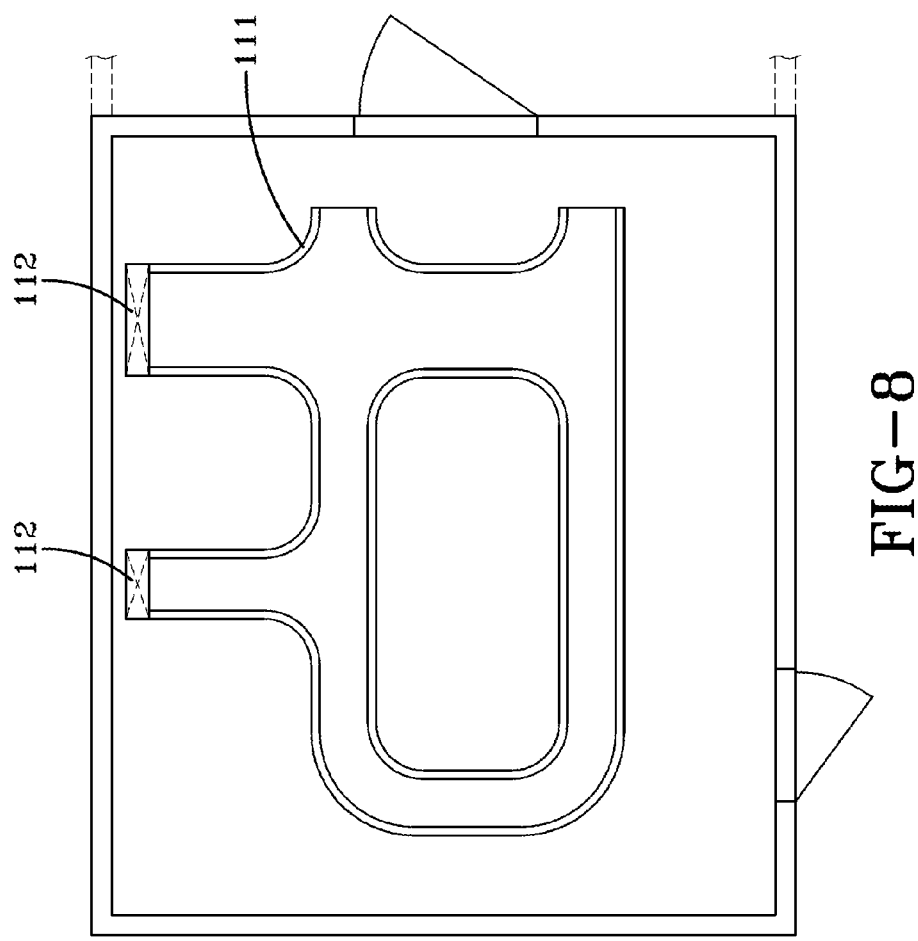
FIG. 8 is a top view of an exemplary cable tray layout for the exemplary base module of FIG. 6.

FIG. 8 shows an embodiment of a base module 101 with a cable tray 111 positioned above modular panels 50 (not shown). The cable tray serves to route cables as they enter the base module, direct them about the base module to their respective modular panels 50 and ultimately to a termination cabinet 112. The cable tray is designed to align and cooperate with a cable tray from one or more expansion modules (not shown), should an expansion module be attached to the base module. In the expanded scenario, the cables would be routed about the modular panels 50 and the cables that are directed to the expansion module and the modular panels 50 would be routed along the open sections of the cable tray to cooperating open sections of cable tray in the respective expansion module(s), and then ultimately back to the termination cabinet of the base module.

Figure 9:
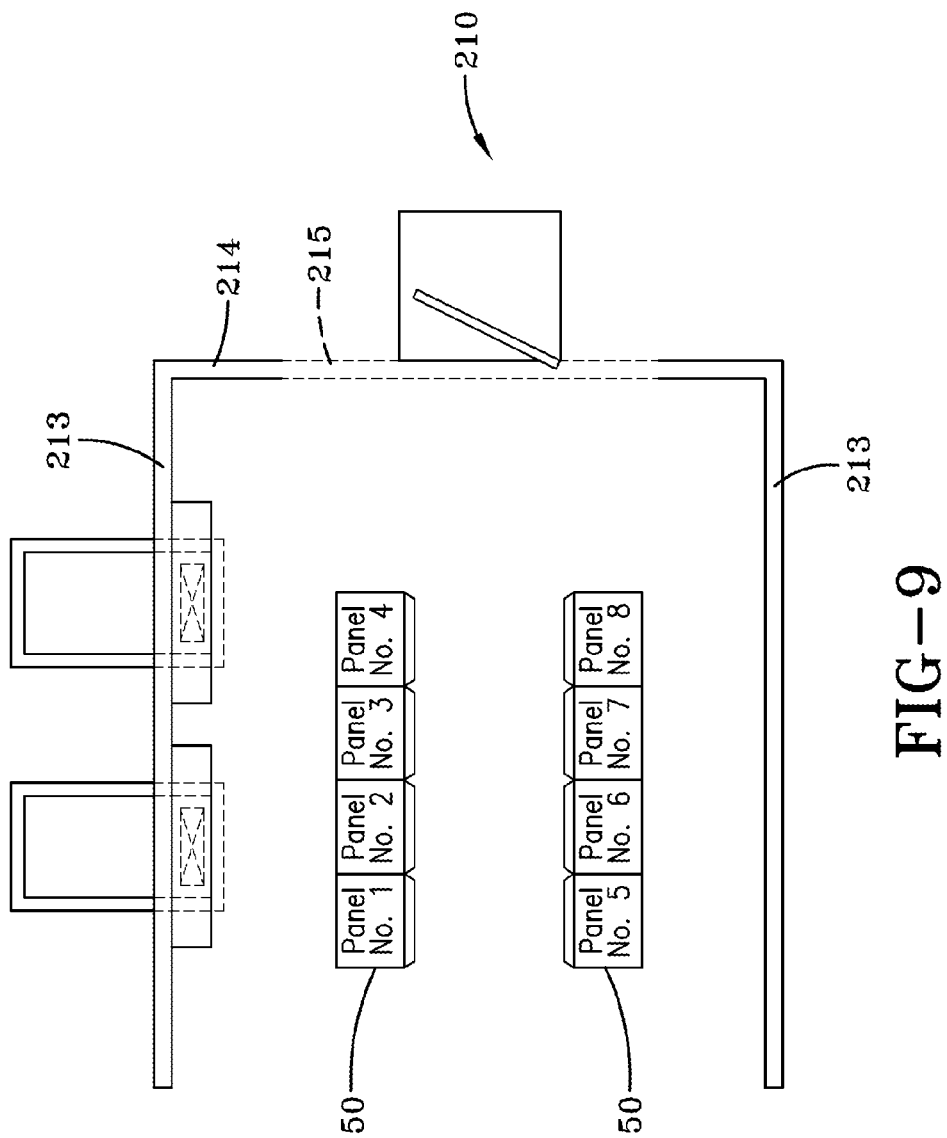
FIG. 9 is a top view of an exemplary embodiment of an expansion module of DICM for housing P&C systems.

FIG. 9 shows an embodiment of an expansion module 210. An expansion module 210 can be used in conjunction with any base module 101 to replace and/or expand existing protection and control assets of distribution, sub-transmission or transmission facilities. An expansion module 210 comprises an open end and three vertical wall members, a pair of opposing side walls 213 and an expansion wall member 214, the expansion wall member including a removable wall section 215. The removable wall section 215 provides an open end for cooperative engagement with another structure when removed. The expansion wall member 214 is adapted in a similar fashion as the expansion wall member 104 of the base module 101. The expansion module 210 also comprises a roof (not shown) extending over the vertical wall members and a base extending underneath. The expansion module 210 further includes environmental conditioning equipment, entry and exit points for cables and modular panels 50 but in other embodiments, the expansion module 210 may include more modular panels 50 and still fall under the inventive concept described herein. In the embodiment shown, the expansion module 210 includes eight modular panels 50. Those of skill in the art will recognize that various numbers of modular panels 50 may be employed and still fall under the inventive concept. The components are positioned to define a walkway through the structure, such that a user may walk through the structure and access the protection and control assets housed therein. The walkway is such that when a substation is expanded, the walkways of the base module 101 substantially align with and cooperate with those of an expansion module 210 structure, allowing access to all of the protection and control assets of the expanded structure.

Each expansion module 210, including all of the assets housed therein, is pretested to meet the needs of the network and any state and federal regulations. Pretesting the assets allows for seamless expansion of an already installed structure (whether a base module 101 or base module 101 and expansion module(s) 210), to allow for quick installation, thereby greatly decreasing the length of any outages.

Figure 10:
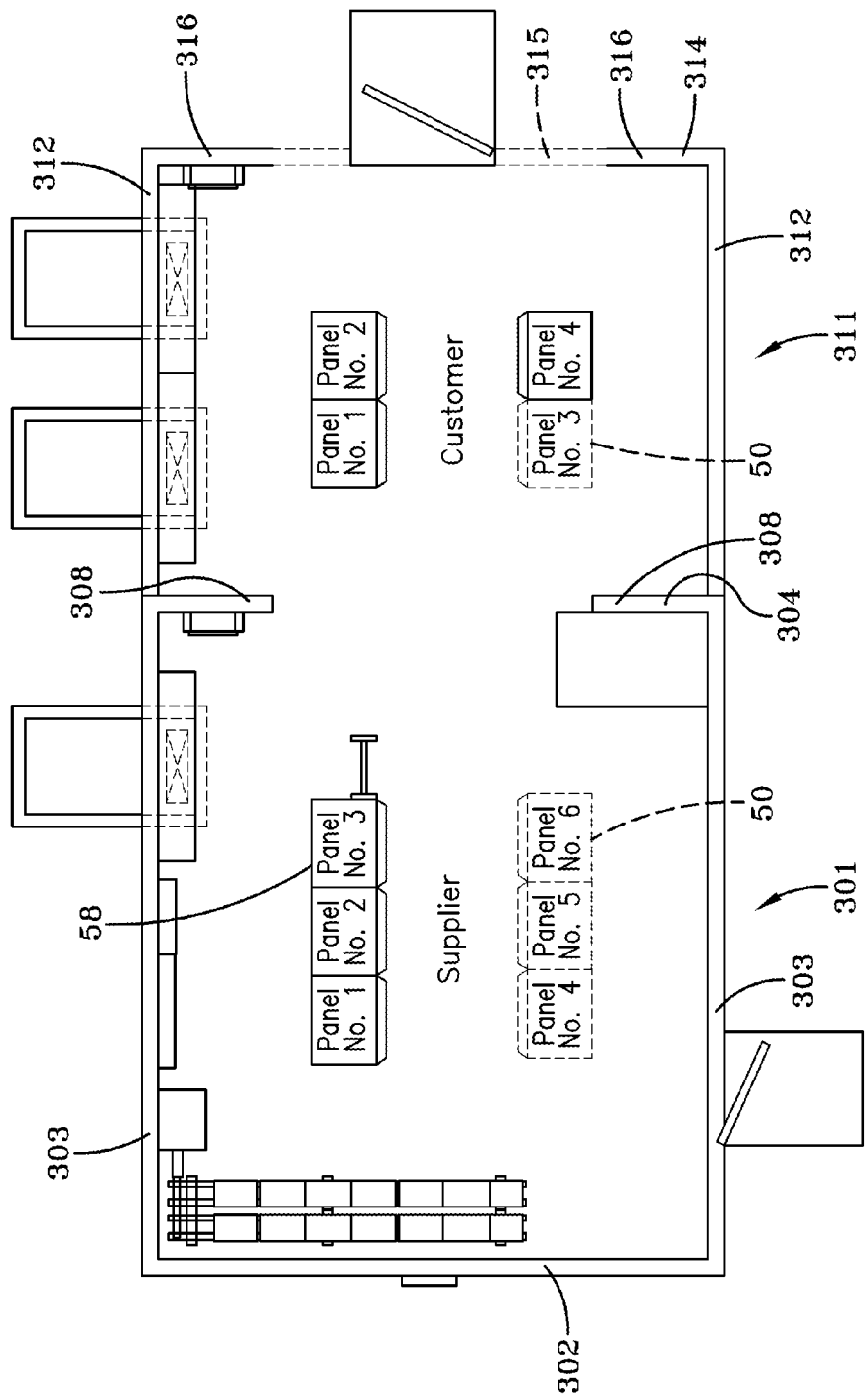
FIG. 10 is a top view of an exemplary expanded module for housing P&C systems.

FIG. 10 shows an embodiment of an expanded structure 300. The expanded structure 300 comprises both a base module 301 and at least one expansion module 311. Here, the base module 301 comprises a first vertical wall member 302, a pair of opposing vertical wall members 303 (one shown with an exhaust fan 317 and a door); an expansion wall member 304 opposite the first vertical wall member 302, the expansion wall 304 member including a removable wall section (not shown) which has been moved to facilitate connection to the expansion module 311; and a roof (not shown) extending across the top of the vertical wall members. The expansion module 311 includes two opposing side walls 312; and a third vertical wall member 314, the third vertical wall member including a removable wall section 315 which has not been removed. In FIG. 10, the two opposing side walls 312 of the expansion module 311 are secured to the opposing vertical wall members 303 of the base module 301 substantially at the corners of the expansion wall member 304. As can be seen from this figure, when the removable wall section of the base module 301 is removed, fixed wall sections 308 remain. The fixed wall sections 308 may provide structural support for the expanded structure 300; provide additional contact for securement of the base module 301 to the expansion module 311; and/or provide support for the joining of the roof of the base module 301 to the roof of the expansion module 311. The removable wall section may comprise a majority of the expansion wall member 304. The fixed wall sections 308 may be positioned on either side of the removable wall section. Additionally, should a network require further expansion, the removable wall section 315 of the expansion module could be removed in the same way, leaving behind fixed wall sections 316 of the expansion module optionally on either side of the removable wall section 315, facilitating further expansion of the structure.

The expanded structure 300 includes similar protection and control assets as the base module 301 and further includes additional assets due to the expansion module 311. The components that make up the protection and control assets are positioned to define a walkway through the expanded structure, such that a user may walk through the structure and access the protection and control assets housed therein. The walkway is such that when a substation is expanded, the walkways of the base module 301 substantially align with and cooperate with those of an expansion module 311 structure, allowing access to all of the protection and control assets of the expanded structure 300.

Furthermore, a method of constructing a modular electricity substation control structure is as follows: the method includes the following steps: preparing a substantially level area for subsequent erection of the control structure thereon; delivering a portable base module with pretested protection and control assets to the level area. The base module comprising a base, a plurality of vertical wall members extending upward from the base, at least one of the vertical wall members including a removable wall section adapted for reversible attachment to the base module for quick removal to facilitate attachment of an expansion module, a roof extending across the top of the vertical wall members; and pre-tested protection and control assets housed within the structure adapted for swift integration into an existing electricity network; and integrating the base module into the electrical substation yard equipment (transformer, circuit breaker, etc.). Optionally, an expansion module may be delivered and secured to an opening on the base module created by removal of the removable wall section. The expansion module may include additional pretested protection and control assets positioned for alignment and cooperation with the assets housed in the base module.

Once built and installed, the building structure can be later expanded or reconfigured to meet changing demands in short order. In addition, the building structure can be relocated in whole or in part with ease.

Having shown and described an embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A method for providing a modular substation protection and control system, comprising:
    providing a one-line diagram for a substation;
    analyzing said one-line diagram to determine protection zones and control zones;
    configuring a computer database to include data comprising:
        protection schemes for said protection zones;
        control schemes for said control zones;
        design modules relating to said protection schemes and control schemes;
        modular protection and control assets related to said design modules;
    configuring the computer database to provide prompts for selection of said modular protection and control assets based on requirements identified in said one-line diagram;
    identifying said modular protection and control assets using said prompts; and
    configuring said computer database to calculate a location of said modular protection and control assets.

2. The method of claim 1, further comprising providing at least one modular panel.

3. The method of claim 2, further comprising providing a plurality of relay plates, said relay plates adapted to releasably support and electronically connect at least one said modular protection and control asset to said at least one modular panel.

4. The method of claim 3, further comprising installing at least one modular protection and control asset into one of said plurality of said relay plates.

5. The method of claim 4, further comprising installing a plurality of relay plates having associated modular protection and control assets into at least one modular panel.

6. The method of claim 1, further comprising providing an expandable building module having at least one terminal cabinet.

7. The method of claim 6, further comprising connecting said expandable building module to an electrical line by way of said terminal cabinet.

8. The method of claim 7, further comprising pre-wiring said expandable building module to receive at least one modular panel; and
    installing said at least one modular panel in said expandable building module.

9. The method of claim 8, further comprising providing a plurality of relay plates in said at least one modular panel, said relay plates adapted to releasably support and electrically connect said modular protection and control asset to said modular panel.

10. The method of claim 9, further comprising installing at least one said modular protection and control asset into at least one of said plurality of said relay plates.

11. The method of claim 10, further comprising monitoring said modular panel using a local area network.

12. A method for providing a modular substation protection and control system using a computer database, comprising:
    selecting at least one modular asset comprising:
        configuring the computer database on a computer device to include data comprising:
            protection schemes for substation components;
            control schemes for substation components;
            design modules for said protection schemes and said control schemes;
            design modules for metering, SCADA, and automation;
            criteria for identifying said design modules;
            modular assets associated with said design modules;
        configuring said computer device to identify all possible protection and control schemes;
        configuring said computer device to identify all design modules for said protection schemes, control schemes, metering, SCADA, and automation;
        configuring said computer device to present criteria for selection of modular assets associated with said design modules; and
        configuring said computer device to identify said at least one modular asset based on selected criteria;
    providing said at least one modular asset identified by said computer device;
    providing a standardized modular panel;
    connecting said at least one modular asset identified by said computer device to a relay plate, said relay plate adapted to releasably support and electrically connect said modular asset to said standardized modular panel; and
    installing said relay plate, connected to said at least one modular asset, into said standardized modular panel.

13. The method of claim 12, further comprising monitoring said at least one modular asset using a local area network.

14. The method of claim 12, further comprising providing an expandable building module having at least one terminal cabinet.

15. The method of claim 14, further comprising:
    connecting said expandable building module to an electrical line by way of said terminal cabinet; and
    pre-wiring said expandable building module to receive said standardized modular panel.

16. The method of claim 15, further comprising:
    installing said standardized modular panel in said expandable building module;
    placing said standardized modular panel in electrical communication with said terminal cabinet; and
    providing a back-up power supply to said expandable building module.

17. The method of claim 16, further comprising:
    providing a pre-wired expansion module;
    expanding said expandable building module by the addition of said expansion module in both physical and electrical communication with said expandable building module; and
    installing at least one standardized modular panel in said expansion module.

18. The method of claim 16, further comprising increasing functionality of said modular panel by installation of additional modular assets, wherein said modular assets have the same or different functionality.

19. A method of providing a modular substation protection and control system using a computer database, comprising the following steps:
- providing a plurality of standardized modular assets;
- providing a one-line diagram for a substation;
- analyzing said one-line diagram to determine protection zones and control zones for said substation;
- configuring a computer device to select one of said plurality of standardized modular assets corresponding to determined protection and control zones, said computer device having a computer database;
- configuring the computer database to include data comprising:
  - protection schemes for said protection zones;
  - control schemes for said control zones;
  - design modules relating to said protection schemes and said control schemes; and
  - standardized modular assets related to said design modules;
- configuring said computer device to present criteria for selection of standardized modular assets;
- configuring said computer device to identify a standardized modular asset based on selected criteria;
- providing a standardized modular panel;
- connecting said identified standardized modular asset to a relay plate, said relay plate adapted to releasably support and electrically connect said modular asset to said standardized modular panel;
- installing said relay plate, connected to said modular asset, into said standardized modular panel;
- providing an expandable building module having at least one terminal cabinet;
- connecting said expandable building module to an electrical line by way of said terminal cabinet;
- pre-wiring said expandable building module to receive at least one standardized modular panel; and
- installing said standardized modular panel in said expandable building module.

20. The method of claim 19, further comprising:
- providing a pre-wired expansion module;
- expanding said expandable building module by the addition of said expansion module in both physical and electrical communication with said expandable building module; and
- installing at least one standardized modular panel in said expansion module.

* * * * *